(12) United States Patent
Wang

(10) Patent No.: US 6,190,743 B1
(45) Date of Patent: Feb. 20, 2001

(54) PHOTOMASK PROTECTION SYSTEM

(75) Inventor: Ching-Bore Wang, Fremont, CA (US)

(73) Assignee: Micro Lithography, Inc., Sunnyvale, CA (US)

( * ) Notice: Under 35 U.S.C. 154(b), the term of this patent shall be extended for 0 days.

(21) Appl. No.: 09/110,636

(22) Filed: Jul. 6, 1998

(51) Int. Cl.$^7$ ....................................................... G03F 1/14
(52) U.S. Cl. ................................................... 428/14; 430/5
(58) Field of Search ................................... 428/14; 430/5

(56) References Cited

U.S. PATENT DOCUMENTS 5,601,955 * 2/1997 Fujita et al. ............................ 428/14

* cited by examiner

Primary Examiner—Alexander S. Thomas

(74) Attorney, Agent, or Firm—Kolisch, Hartwell, Dickinson, McCormack & Heuser

(57) ABSTRACT

The present invention provides a photomask protection system for minimizing contamination resulting from the removal of a pellicle from a photomask. The system comprises a continuous wall attached to the photomask and disposed between the region of the mask where the pellicle attaches and the photomask pattern. The wall is dimensioned to fit within the pellicle and to be spaced from the pellicle membrane and the pellicle frame. The wall minimizes the likelihood that any contaminants generated by the removal of a pellicle frame from the photomask surface will reach the photomask pattern. The wall may be coated with an adhesive to capture any contaminants that contact it. The present invention also provides a method for minimizing the contamination of a photomask during the removal and replacement of a pellicle, comprising the steps of attaching a barrier to the photomask surface wherein the barrier surrounds the photomask pattern and fits within the pellicle without contacting the pellicle frame or pellicle membrane.

11 Claims, 1 Drawing Sheet

PHOTOMASK PROTECTION SYSTEM

BACKGROUND OF THE INVENTION

The present invention relates to protective barriers for photomasks, and more particularly to a barrier for minimizing the contamination of a photomask during the removal and replacement of a pellicle.

In the semi-conductor chip industry it is well known that pattern transfer from a photomask to a substrate is accomplished by exposing a mask to a light source. During the pattern transfer process, also called the photolithographic process, patterns on the photomask are projected onto the substrate which has been treated with a photo-sensitive sensitive substance. This results in the mask etchings being reproduced onto the substrate. Unfortunately, any foreign substance on the surface of the mask will also be reproduced on the substrate and therefore will interfere with proper pattern transfer to the substrate.

To eliminate contamination of the mask surface, a framed, thin membrane known as a pellicle is mounted on the mask surface, such that the pellicle membrane extends parallel to the mask at a predetermined distance spaced away from it. Any contamination which would ordinarily land of the mask surface instead falls on the pellicle membrane.

Pellicles substantially eliminate the above problem because contamination on the pellicle membrane will not be projected onto the substrate. The frame of the pellicle supports the membrane at a distance spaced away from the mask surface so any particles or other contaminants on the pellicle membrane will be out of focus during pattern transfer.

Pellicle frames, with the pellicle membrane already attached, are mounted directly to the surface of the mask by use of a double-sided adhesive. When it becomes necessary to replace the pellicle, the entire pellicle is removed from the mask. The removal of the pellicle often generates particulate contaminants. Some possible contaminants include small fragments of dried adhesive loosened and exposed by the removal of the pellicle, and particulate generated by mechanical contact between tools used to remove the pellicle and the pellicle frame. These contaminants are generated close to the surface of the mask, and can reach the pattern of the photomask by simple lateral movement. Thus, following the changing of a pellicle, cleaning and reinspection of the mask may be required to ensure that its original quality has not been affected by the pellicle changing process. This increases the cost of pellicle replacement in terms of time, money, and potential damage to the mask.

Solutions to the contamination problem in the prior art include cleaning the mask after changing the pellicle, and utilizing a removable pellicle mounting system. Cleaning has the disadvantage of potentially increasing contamination. Thus, masks that have been cleaned require reinspection. Another solution is offered by the use of a removable pellicle as disclosed in U.S. Pat. No. 4,737,387 to Yen. The invention in the '387 patent comprises a mounting frame attached to a photomask surface by an adhesive, onto which a pellicle is mounted by an adhesive. The pellicle can be removed from the mounting frame without disrupting the adhesive bond between the mounting frame and the photomask. Additionally, the mounting frame extends somewhat above the surface of the photomask, providing a physical impediment that particulate must surmount to reach the photomask pattern. However, this solution still poses problems. First, because the mounting frame mounts the pellicle on a shoulder of the frame, both the lower face and the inside face of the pellicle frame are in mechanical and perhaps adhesive contact with the mounting frame. The amount of contact area between a pellicle mounted to a mounting frame and the mounting frame itself is greater than the contact area between a pellicle adhered directly to a photomask and the photomask. Thus, when the pellicle is removed from the mounting frame, a greater surface area of the pellicle frame is mechanically disrupted, and perhaps a greater area of adhesive residue is exposed, by the removal process than would be if the pellicle had been directly mounted to and removed from the photomask. The result is a potential increase in the amount of particulate generated by the changing of a pellicle.

Another disadvantage to the use of a removable pellicle as disclosed in the '387 patent to Yen is that the pellicle mounting frame works with only one size or shape of pellicle. If a different pellicle is desired, the mounting frame must be removed and replaced. The removal and replacement of a mounting frame might create an additional source of contamination and increase the cost of changing pellicle sizes or shapes.

Yet another disadvantage to the removable pellicle of the '387 patent to Yen is that the pellicle frame is in contact with the mounting frame for the entire height of the mounting frame shoulder. Thus, upon the removal of a pellicle, particulate may be generated at the highest point of the mounting frame shoulder. Particulate generated at this point encounter no physical barrier between the point of generation and the photomask pattern, and therefore may easily contaminate the pattern.

Accordingly, it is a general object of the present invention to provide an improved mechanism and method for preventing the contamination of a photomask pattern by particulate generated during the removal and replacement of a pellicle. More specific objects of the present invention are to provide a mechanism and method which are simple to fabricate and more readily adaptable to the use of pellicles of different sizes and shapes.

SUMMARY OF THE INVENTION

One aspect of the present invention provides a photomask protection system for minimizing contamination resulting from the removal of a pellicle from a photomask. The system comprises a continuous wall attached to the photomask and disposed between the region of the mask where the pellicle attaches and the photomask pattern. The wall is dimensioned to fit within the pellicle and to be spaced from the pellicle membrane and the pellicle frame. The wall minimizes the likelihood that any contaminants generated by the removal of a pellicle frame from the photomask surface will reach the photomask pattern. The wall may be coated with an adhesive to capture any contaminants that contact it.

Another aspect of the invention provides a barrier for minimizing the contamination of a photomask pattern during the removal and replacement of a pellicle, comprising a continuous wall for mounting to a photomask to surround the photomask pattern. The continuous wall is dimensioned to fit inside a pellicle that is removably attached to the photomask and to be spaced from the pellicle membrane and pellicle frame. Thus, the continuous wall is disposed between any particulate generated by the removal of a pellicle from a photomask and the photomask pattern, reducing the likelihood of particulate reaching the photomask pattern, yet is not in mechanical contact with the pellicle during removal.

Another aspect of the invention comprises a method for minimizing the contamination of a photomask pattern during the removal and replacement of a pellicle, including the steps of (1) attaching a continuous wall to the photomask surface so that the wall surrounds the photomask pattern, and (2) attaching a pellicle to the photomask surface so that the wall is located between the photomask pattern and the pellicle frame, and the pellicle membrane and frame are spaced from the wall. A barrier to particulate contamination of the photomask pattern is thus formed.

By using the apparatus of the present invention, and/or by practicing the method of the present invention, the drawbacks encountered with prior art devices and methods are not experienced. Other various objects and advantages which are attained by the invention will become more fully apparent as the description which now follows is read in conjunction with the drawings.

DETAILED DESCRIPTION OF THE INVENTION

Figure 1:
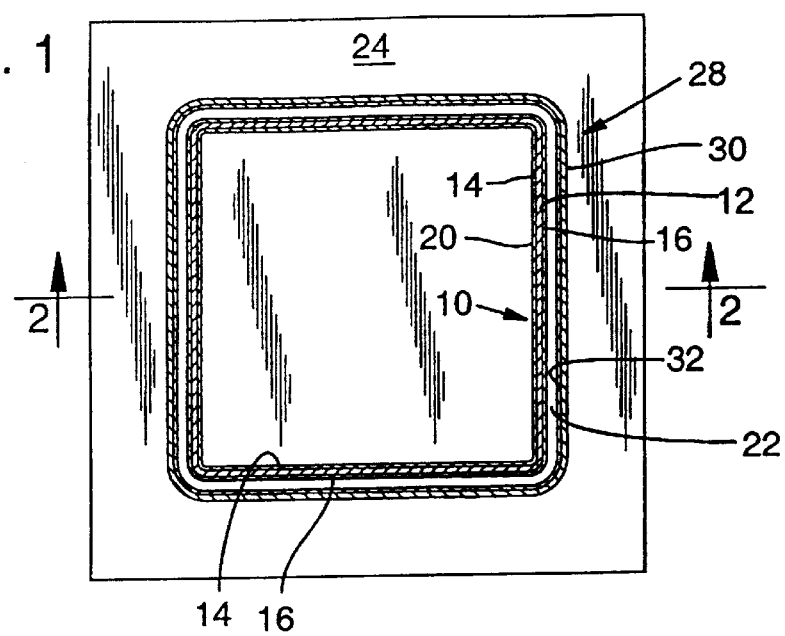
FIG. 1 is a top sectional view of the apparatus of the present invention taken along line 1—1 of FIG. 2.
Figure 2:
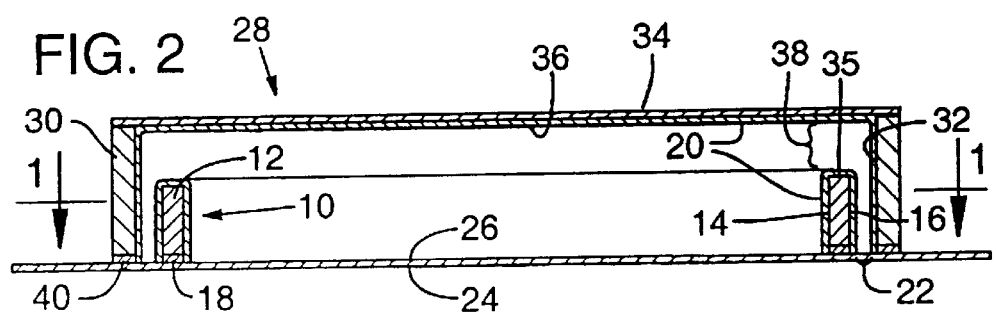
FIG. 2 is an enlarged, side sectional view taken along line 2—2 of FIG. 1.
Figure 3:
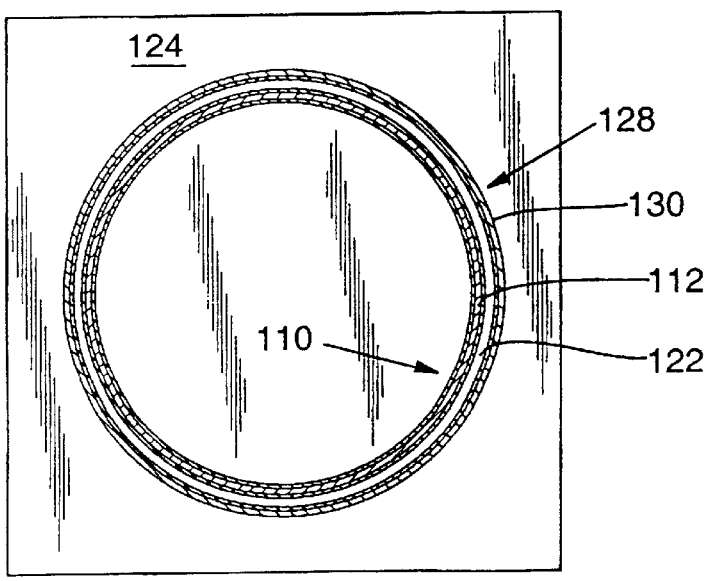
FIG. 3 is a top sectional view similar to FIG. 1 of a variation of the embodiment of FIGS. 1 and 2.

The objects of the invention are best achieved when the invention takes the form depicted in FIGS. 1–3. One configuration of the preferred embodiment of the description is shown in FIGS. 1 and 2. FIG. 1 shows a contamination barrier 10 comprising a continuous wall 12 attached to a photomask 24, the wall including an inner surface 14 and an outer surface 16. The photomask includes a surface 26, visible in FIG. 2, with a pattern (not shown) to be transferred to a wafer. The continuous wall would normally surround the photomask pattern without obscuring the pattern in any way. The continuous wall 12 is dimensioned to fit inside the pellicle frame 30 of pellicle 28 when the pellicle is mounted to the photomask 24, such that the continuous wall 12 is spaced from the inside surface 32 of the pellicle frame 30, as indicated at 22. The continuous wall is thus disposed between the photomask pattern and the pellicle frame. No potentially contaminating particulate will be generated by mechanically disruptive contact between the continuous wall and the pellicle frame when the pellicle is removed for replacement due to the space between the continuous wall and the pellicle frame. Moreover, the wall will minimize the likelihood of contaminants generated at the photomask surface during the removal of a pellicle from reaching the photomask pattern by acting as a barrier between the region of the photomask where the pellicle was attached and the photomask pattern.

FIG. 2 shows a continuous wall 12 mounted to a photomask 24 with a pellicle 28 also mounted to the photomask 24. The continuous wall 12 is attached to the photomask surface 26 by a suitable adhesive 18. The pellicle is removably attached to the photomask surface 26 by an adhesive 40, chosen from adhesives that are known in the art to be suitable for this purpose. Though the barrier 10 is intended to be a substantially permanent fixture to the surface of a photomask, the need to change barriers may arise. For instance, even though a barrier mounted on a photomask does not need to be the same shape or size as the pellicle used on the same photomask, if the use of a pellicle of a substantially different shape or size on the photomask is desired, the user may want to change barriers. Thus, the adhesive 18 is preferably one of the same adhesives well known in the art for removably mounting pellicles to photomasks, so that the barrier may be removed should the need arise. For example, conventional double-sided tape is well suited for this purpose, with one suitable tape being "Scotch Brand, Magic Plus Removable Transparent Tape" manufactured by the 3M company. Other possible adhesive tapes include 3M "701" or "447", or "Mactac 2904" manufactured by the Morgan Adhesive Company.

An adhesive 20 may be applied to the inner surface 14, the outer surface 16, or substantially the entire surface of the continuous wall 12. The same adhesive, or a different adhesive, may also be applied to the inner surfaces of the pellicle, also indicated at 20. This adhesive is applied to capture any contaminants that may come into contact with the continuous wall 12. The adhesive 20 may comprise an adhesive that remains tacky throughout the useful life of the barrier 10, or it may comprise a curable adhesive for the delayed entrapment of contaminant particles as disclosed in Yen, U.S. Pat. No. 5,314,728, which is incorporated by reference into this disclosure. Examples of adhesives that remain tacky include conventional double-sided tape such as Scotch Brand, Magic Plus Removable Transparent Tape" manufactured by the 3M company, 3M "701" or "447" adhesive tapes, or "Mactac 2904" manufactured by the Morgan Adhesive Company. Examples of curable adhesives include UV curable materials such as Norland No. 61 adhesive, marketed by Norland Products Inc., or a standard epoxy mixed to cure over a desired time period.

The continuous wall does not extend to the full height of the pellicle frame 30. Rather, it extends upwards from the photomask surface 26 to about ¾ of the height of the pellicle frame. Thus, the top surface 35 of the continuous wall 12 is spaced from the inner surface 36 of the pellicle membrane 34, as indicated at 38. The spacing remains between the pellicle and the barrier during the normal use of the barrier, allowing the pellicle to be removed without any mechanically disruptive contact between the barrier and the pellicle. Though the preferred height of the continuous wall of this embodiment of the barrier is approximately ¾ the height of the pellicle frame, the continuous wall could have a greater or lesser height, with only the requirement that the top surface 35 of the wall remain spaced from the lower surface of the pellicle membrane 36 to preserve the spacing between the pellicle membrane and the continuous wall. The purpose of this spacing is two-fold. First, the spacing prevents the creation of any contaminants through mechanical contact between the wall and pellicle. Second, the spacing preserves the even tension of the pellicle membrane across its width and does not warp the membrane by contacting it so that light rays passing through the pellicle membrane are neither obstructed nor refracted or bent in any other way.

The embodiment of the invention described above can take a variety of shapes. Whereas FIG. 1 depicts a substantially rectangular pellicle and continuous wall, FIG. 3 depicts a substantially circular pellicle and continuous wall. A parallel numbering scheme is used in FIG. 3; for instance, the photomask 24 in FIGS. 1 and 2 is shown at 124 in FIG. 3. In FIG. 3, a barrier 110 comprising a substantially circular continuous wall 112 is shown mounted on a photomask 124 for use with a circular pellicle 128. The continuous wall 112 is spaced from the pellicle frame 130 as indicated at 122. The side sectional view of FIG. 3 is identical to that of FIG. 1 depicted in FIG. 2. Though only substantially rectangular and substantially circular barriers are depicted in the figures, any other shape may be used to best compliment the configuration of a given photomask.

Accordingly, while the preferred method of practicing the present invention and a preferred embodiment of the apparatus of the present invention have been described, other variations may be made without departing from the spirit of the invention.

It is claimed and desired to secure by Letters Patent:

1. A photomask protection system for minimizing contamination resulting from the removal of a pellicle from a photomask, the pellicle including a pellicle membrane and pellicle frame which is removably mounted to the photomask, the pellicle membrane including an inside surface and the pellicle frame including an inside surface, the photomask including a surface with a centrally disposed pattern, the protection system comprising:

a continuous wall attached to the photomask, wherein the continuous wall is dimensioned to fit inside the pellicle with the pellicle attached to the photomask surface, and is spaced from the inside surfaces of the pellicle membrane and the pellicle frame, so that when the pellicle is removed from the photomask for replacement purposes, the continuous wall is disposed between the photomask pattern and the region where the pellicle is mounted to the photomask and reduces the likelihood of contaminants generated by the pellicle removal process reaching the photomask pattern.

2. The apparatus of claim 1 wherein the continuous wall includes an inner side and an outer side, and wherein the inner side and outer side are substantially vertical.

3. The apparatus of claim 2 wherein at least a portion of the outer side of the continuous wall is coated with an adhesive to capture particulate contacting the outer side.

4. The apparatus of claim 3 wherein at least a portion of the inner side of the continuous wall is coated with an adhesive to capture particulate contacting the inner side.

5. The apparatus of claim 4 wherein substantially all of the continuous wall is coated with an adhesive to capture particulate contacting the continuous wall.

6. A method for minimizing contamination of a photomask during the removal and replacement of a pellicle, the pellicle including a pellicle frame and a pellicle membrane, the photomask including a photomask surface with a centrally disposed photomask pattern, the method comprising:

attaching a continuous wall to the photomask surface wherein the continuous wall surrounds the photomask pattern; and attaching the pellicle to the photomask surface so that the continuous wall is located between the photomask pattern and the pellicle frame, and the pellicle membrane and frame are spaced from the continuous wall.

7. The method of claim 6 wherein the step of attaching the continuous wall to the photomask surface includes attaching the continuous wall to the photomask such that the sides of the wall are substantially perpendicular to the photomask surface.

8. The method of claim 7 further comprising applying an adhesive to at least a portion of the outer side of the continuous wall before the continuous wall is attached to the photomask surface.

9. The method of claim 8 further comprising applying an adhesive to at least a portion of the inner side of the continuous wall before the continuous wall is attached to the photomask surface.

10. The method of claim 9 further comprising applying an adhesive to substantially all of the continuous wall before the continuous wall is attached to the photomask surface.

11. The method of claim 10 further comprising removing the pellicle frame from the photomask surface, wherein particulate is generated by the removal process and wherein the likelihood that the particulate will reach the photomask pattern is reduced by the disposition of the continuous wall between the particulate and the photomask pattern.

* * * * *